United States Patent [19]

Hackleman

[11] Patent Number: 5,734,394
[45] Date of Patent: Mar. 31, 1998

[54] KINEMATICALLY FIXING FLEX CIRCUIT TO PWA PRINTBAR

[75] Inventor: David E. Hackleman, Monmouth, Oreg.

[73] Assignee: Hewlett-Packard, Palo Alto, Calif.

[21] Appl. No.: 375,754

[22] Filed: Jan. 20, 1995

[51] Int. Cl.⁶ .............................. B41J 2/155; H01R 29/00
[52] U.S. Cl. .................................. 347/42; 347/50; 439/67
[58] Field of Search ........................ 347/42, 50; 439/67, 439/493

[56] References Cited

U.S. PATENT DOCUMENTS

| | | | |
|---|---|---|---|
| 5,418,691 | 5/1995 | Tokura | 361/803 |
| 5,528,272 | 6/1996 | Quinn et al. | 347/42 |

Primary Examiner—Benjamin R. Fuller
Assistant Examiner—Craig A. Hallacher

[57] ABSTRACT

A page-wide-array ("PWA") printhead includes a flex circuit thermal-kinematically fixed to a printbar. Thermal kinematic fixturing directs thermal expansion and contraction of the flex circuit along known paths. One effect of the invention is that over a given temperature range, PWA printhead nozzles remain aligned and nozzle spacing changes uniformly across the printhead. To accomplish the fixturing, a sealant, fixtures, and a reference barrier hold the flex circuit to the printbar. The flex circuit defines elongated slots receiving a fixture post. Each slot and fixture defines a 1-D connection or free-floating connection in an xy-plane. For a 1-D connection thermal displacement occurs in only one direction as defined by the slot orientation. For a free-floating connection thermal displacement is free-floating in the xy-plane. The reference barrier is located on the printbar and defines a corner "bench mark" for the flex circuit. All expansion or contraction of the flex material occurs relative the flex circuit edges abutting the reference barrier. Points of the flex circuit away from the reference barrier are free (in a thermal kinematic sense) to move locally for small distances.

12 Claims, 4 Drawing Sheets

KINEMATICALLY FIXING FLEX CIRCUIT TO PWA PRINTBAR

CROSS REFERENCE TO RELATED APPLICATIONS

This invention is related to U.S. patent application Ser. No. 08/376,320 filed on *(the same day)* for PWA Inkjet Print Element With Resident Memory (Docket No. 191041), and U.S. patent application Ser. No. 08/375,743 filed on *(the same day)* for Controlling PWA Inkier Nozzle Timing as a Function of Media Speed (Docket No. 191039), those applications are incorporated herein by reference and made a part hereof.

BACKGROUND OF THE INVENTION

This invention relates generally to inkjet printhead construction, and more particularly, to a page-wide-array ("PWA") inkjet printhead having a flex circuit kinematically fixed to a printbar so as to maintain precise alignment of printhead nozzles over an operating temperature range.

In the field of inkjet printing, ink is delivered under pressure to a printhead's nozzle area. According to one method, the ink is heated causing a vapor bubble to form in a nozzle which then ejects the ink as a droplet. Droplets of repeatable velocity and volume are ejected from respective nozzles to effectively imprint characters and graphic markings onto a printout.

An inkjet printhead is formed by a substrate plus several layers defining multiple nozzle areas. The substrate and layer qualities and dimensions are selected to achieve desired thermodynamic and hydrodynamic conditions within each nozzle. Various commonly-assigned patents teach aspects of printhead fabrication, including U.S. Pat. No. 4,513,298 (Scheu); U.S. Pat. No. 4,535,343 (Wright et al.); U.S. Pat. No. 4,794,410 (Taub et al.); U.S. Pat. No. 4,847,630 (Bhaskar et al.); U.S. Pat. No. 4,862,197 (Stoffel); and U.S. Pat. No. 4,894,664 (Tsung Pan).

Conventional inkjet printheads extend over a limited portion of a pagewidth and scan across the page. A page-wide-array ("PWA") printhead extends over an entire pagewidth (e.g., 8.5", 11", A4 width) and is fixed relative to the media path. The PWA printhead is formed on an elongated printbar and includes thousands of nozzles. The PWA printbar is generally oriented orthogonally to the paper path. During operation, the printbar and PWA printhead are fixed while a page is fed adjacent to the printhead. The PWA printhead prints one or more lines at a time as the page moves relative to the printhead. This compares to the printing of multiple characters at a time as achieved by scanning-type printheads.

In a PWA inkjet printhead, the printhead is formed by a flexible printed circuit ("flex circuit") coupled to the printbar. Attached to the flex circuit are silicon substrates in which are formed nozzle chambers with firing resistors. The flex circuit with silicon substrates are adhesively attached to the printbar. The printbar includes recessed areas for receiving respective silicon substrates. Signal paths in the flex circuit carry signals to the firing resistors. An addressed firing resistor heats up ink in a corresponding nozzle chamber resulting in an ejection of an ink droplet (i.e., an "inkjet").

To achieve acceptable performance by an inkjet printhead, it is essential that the print nozzles maintain their relative alignment. Proper alignment assures that characters or graphics are formed of a desired shape at a desired location with a desired orientation. Misalignment of one or more nozzles compromises output clarity, location and/or orientation. In particular, it is important to maintain respective positioning, spacing and orientation among nozzles.

This invention relates to maintaining internal alignment within the printhead itself. For a conventional scanning printhead, internal alignment is not a significant problem. Typically, an outer flexible printed circuit is welded or adhesively attached to an inkjet "pen body". Such attachment process is stable enough, given the printhead size (e.g., about 0.15 to 0.50 inches), to maintain internal printhead alignment under varying operating conditions. A PWA printhead, however, is much longer than a conventional scanning printhead. Expected PWA printhead operating conditions encompass an operating temperature range of approximately 15° C. to 125° C. Given the size of the PWA printhead, the precise spacing requirement for thousands of nozzles spanning the printhead length and the large temperature variations expected, the thermal expansion and contraction of printhead components can significantly impact and compromise printhead performance. In particular, the thermal expansion and contraction tends to alter the positioning or alignment of nozzles along the printhead. Accordingly, there is a need for precisely controlling the thermal response of the PWA printhead to maintain print quality over the operating temperature range.

SUMMARY OF THE INVENTION

According to the invention, a page-wide-array ("PWA") printhead includes a flexible printed circuit ("flex circuit") kinematically fixed to a printbar so as to control the thermal response characteristics of the flex circuit and printbar. A thermal kinematic fixturing methodology is used. The term thermal kinematic fixturing as used herein refers to the attaching of two objects in which relative displacement of the objects due to thermal expansion or contraction is precisely controlled. In particular, thermal expansion and contraction of the flex circuit cause displacements relative to the underlying printbar along known paths. Although the printbar and flex material have independent thermal responses, relative planar displacements between portions of the printbar and flex circuit are directed and reproducible. This contrasts with the random displacements occurring without kinematic fixturing. One effect of the invention is that over a given temperature range (e.g., 15° C. to 125° C.), PWA printhead nozzle spacing changes uniformly across the printhead to maintain nozzle alignment. Further, the nozzles return to an original spacing when the operating temperature returns to an original temperature.

According to one aspect of the invention, the flex circuit is fixed to the printbar by a sealant and a plurality of fixtures. The sealant keeps the flex circuit held to the printbar, restricting one degree of freedom (e.g., displacement along the z-axis). In one embodiment the fixtures provide additional restraint along the z-axis, reducing the adhesion requirement of the sealant. In specific embodiments the fixtures are integrated into, welded or otherwise attached to the printbar. In addition, many of the fixtures restrict another degree of freedom in a plane of flex circuit.

In one embodiment, the fixtures are formed as posts on the printbar. In some embodiments the posts are approximately the same height as the thickness of the flex circuit so that the posts are flush with the flex circuit. In other embodiments, caps are attached (e.g., by welding, precision screw) to the posts providing restraint along a z-axis.

According to another aspect of the invention, the flex circuit defines a plurality of slots. When attaching the flex circuit to the printbar, a fixture (e.g., post) is received into a respective slot. Each slot has a prescribed orientation allowing thermal displacements of the flex circuit relative to the fixture and printbar in the direction of the slot. Different slots have different orientations prescribed so as to avoid stress in the flex material during expansion and contraction.

Slot orientations are defined as floating-x, floating-y or floating-xy. A floating-x slot allows displacement to occur along an x-axis of the xy-plane, while restraining displacement along a y-axis. A floating-y slot allows displacement to occur along a y-axis, while restraining displacement along an x-axis. A floating-xy slot allows displacement to occur along both the x-axis and y-axis. A fixture with a floating-x slot or a floating-y slot is referred to as a one-dimensional ("1-D") connection relative to the xy-plane. A fixture with a floating-xy slot is referred to as a free-floating connection relative to the xy-plane. In the vicinity of a 1-D connection, the flex circuit is (i) constrained along the z-axis by the sealant, (ii) constrained in one direction in the xy-plane by the fixture, and (iii) floating (in a thermal kinematic sense) in a perpendicular direction in the xy-plane. The slot of a 1-D connection thereby directs thermal expansion and contraction to occur along a defined, reproducible path (i.e., the slot) in the plane (e.g., xy-plane) of the printhead. In the vicinity of a free-floating connection, the flex circuit is (i) constrained along the z-axis by the sealant, and (ii) floating (in a thermal kinematic sense) in the xy-plane. By strategically positioning and orienting 1-D and free-floating connections, thermal expansion and contraction of the printhead components is directed so that nozzles remain substantially aligned and nozzle spacing remains substantially uniform over the length of the printhead at any operating temperature.

According to another aspect of the invention, a reference barrier on the printbar forms two edges or a corner adjacent to the flex circuit. The reference barrier defines a 2-D connection between the flex circuit and printbar in the xy-plane. Such reference barrier confines flex circuit displacement in the xy-plane to occur away from the barrier. Thus, the barrier serves as a bench mark for the printhead. All expansion or contraction of the flex circuit occurs relative to the bench mark. Because the flex circuit cannot move beyond the barrier, the flex circuit edges remain fixed and thermal expansion occurs away from the barrier.

In one embodiment the reference barrier is formed by a corner having two edges receiving abutment of two flex circuit edges. In another embodiment the reference barrier is formed by a fixture and flex circuit opening. The opening receives a pin precisely mating to the opening to define a 2-D connection restraining flex circuit displacement relative to the printbar in both axes of the xy-plane.

The flex circuit corner or area abutting the reference barrier is set accurately in three dimensions (x-axis, y-axis and z-axis) respective to the printbar. Other points of the flex circuit away from the barrier are floating locally in one or two orthogonal directions over a small distance. Such small distance is a function of the distance between the reference barrier and the point on the flex circuit, the coefficient of thermal expansion of the flex circuit material, and the total temperature change from a rest temperature condition (i.e., ambient room temperature) to an operating temperature condition.

According to another aspect of the invention, the reference barrier serves as a bench mark for aligning to the rest of the printer system (e.g., media transport subsystem).

One advantage of the invention is that relative displacements between flex material and printbar are directed and reproducible over a given operating temperature range. An advantageous effect is that nozzle alignment is substantially maintained across the printhead for variations in temperature. Another advantageous effect is that nozzle spacing changes uniformly across the printhead for variations in temperature. Another advantageous effect is that nozzle spacing returns to an original spacing upon return to a rest temperature. A meritorious effect of this invention is that the reproducible thermal response enables print quality to be reliable over an entire operating temperature range.

These and other aspects and advantages of the invention will be better understood by reference to the following detailed description taken in conjunction with the accompanying drawings.

DESCRIPTION OF SPECIFIC EMBODIMENTS

Printhead Alignment

Figure 1:
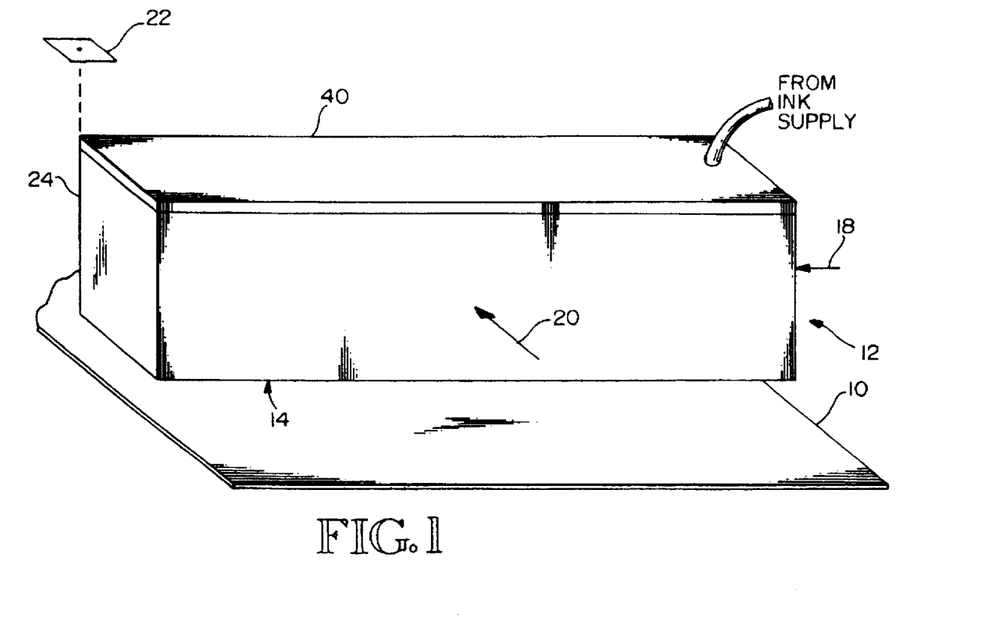
FIG. 1 is a perspective view of a page-wide-array ("PWA") print element positioned relative to a media sheet.

FIG. 1 shows a media sheet 10 moving relative to an inkjet page-wide-array ("PWA") printer element 12 in an inkjet printer. The PWA print element 12 includes a printhead 14 (see FIG. 2) with thousands of nozzles 16 (see FIG. 6) spanning a pagewidth. To achieve and maintain print quality the alignment between printhead 14 and media sheet 10 needs to be known. In addition, the alignment of nozzles 16 on the printhead 14 needs to be precisely maintained. Variations in alignment (e.g., between nozzles 16, or between printhead 14 and media sheet 10) cause ink to be ejected onto the sheet 10 in spots other than where intended, thereby compromising print quality.

For a page wide array printhead 14 having a resolution of 600 dots per inch, more than 5000 nozzles 16 span an 8.5 inch pagewidth. Across an inch of the printhead 14 there are at least 600 nozzles having precise alignment. Maintaining such alignment across the entire PWA printhead 14 is a significant challenge due to the thermal expansion and contraction of printhead components over the operating temperature range (e.g., 15° C. to 125° C.). Stresses in the printhead 14 can randomly tug the nozzles 16 out of alignment and randomly vary the spacing of nozzles 16. Because the PWA printhead 14 spans an entire pagewidth, the temperature effects are more pronounced than for a conventional scanning printhead spanning only approximately 0.15 to 0.50 inches. Accordingly, it is important to account for thermal responses when implementing a PWA printhead 14.

Following is an overview of the PWA printer element 12 structure and a description of the thermal kinematic fixturing method implemented to maintain nozzle 16 alignment over a substantial operating temperature range of 15° C. to 125° C.

Page-Wide-Array ("PWA") Printer Element Structure

Figure 2:
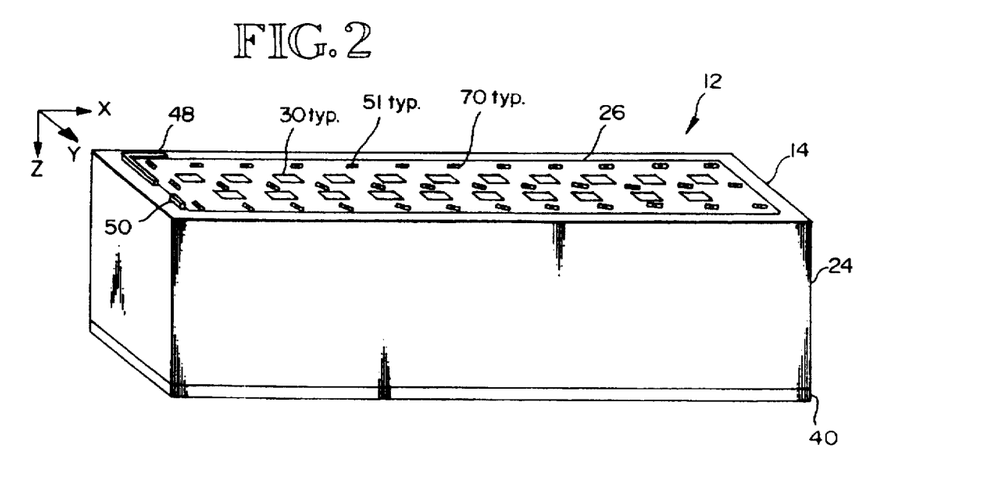
FIG. 2 is another perspective view of the PWA print element showing the printhead with the flex circuit kinematically attached to the printbar according to an embodiment of the method and apparatus of this invention.

FIG. 1 shows a PWA printer element 12 as positioned for inkjet printing onto a media sheet 10. FIG. 2 shows the PWA printer element 12 at a different orientation revealing the PWA printhead 14. The printer element 12 includes a printbar 24, a flexible printed circuit ("flex circuit") 26, an array of nozzles (see FIG. 6) and a resident ink reservoir (not shown). The flex circuit 26 is attached to the printbar 24 to define a printhead 14. Signals from a print processor (not shown) are routed to the flex circuit 26, then along conductive paths in the flex circuit 26 to memory and/or nozzle circuits.

Figure 6:
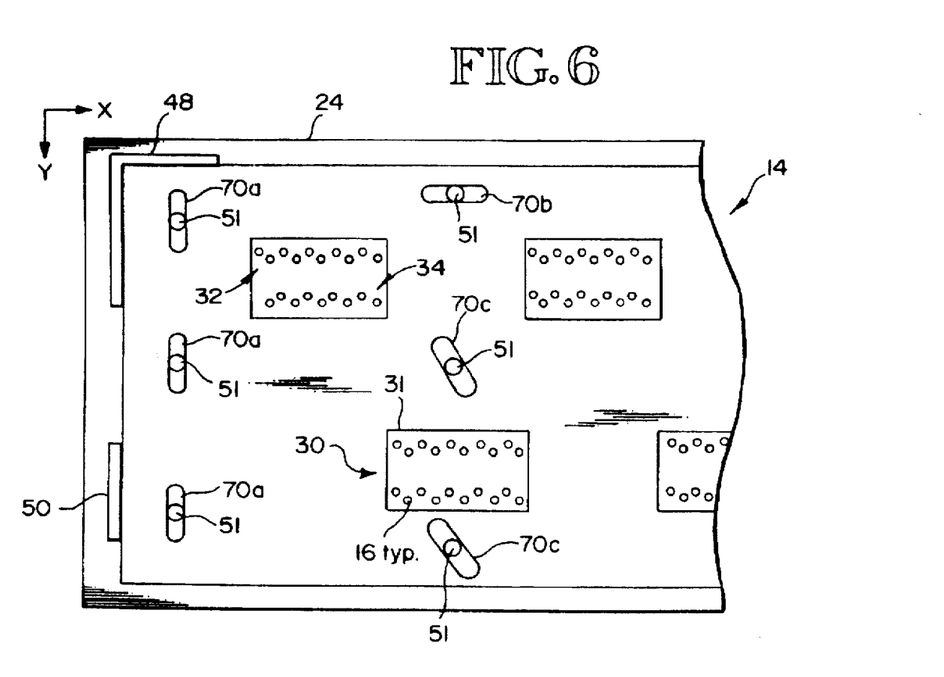
FIG. 6 is a partial sectional view of the flex circuit and printbar of FIGS. 1 and 2.

The printhead 14 includes thousands of nozzles 16 organized in groups 30. Referring to FIG. 6, each group 30 includes two rows 32, 34 of nozzles 16. In one embodiment, each nozzle 16 is defined by an orifice in the flex circuit 26 and by a nozzle chamber formed on a silicon dye attached to the underside of the flex circuit. In other embodiments, a nozzle plate separate from the flex circuit 26 defines the orifice for a nozzle. Each one or more groups 30 have nozzle chambers defined on a common silicon substrate. A nozzle chamber is formed on the substrate to include a firing resistor, insulative layer(s), passivation layer(s) and several chamber barriers according to known nozzle construction techniques. The firing resistor is addressed by a signal traveling from a print processor to the flex circuit 26, then along a particular conductive path of the flex circuit 26 to the firing resistor. In another embodiment, the firing resistor is addressed by a signal from printbar memory under the control of a printhead controller. The nozzle chamber receives ink from a resident reservoir. When the firing resistor is activated, ink in the nozzle chamber is heated. Some of the ink is vaporized and some is displaced out of the chamber through the orifice in the flex circuit 26. By addressing many firing resistors at a time across the pagewidth, the PWA printhead 14 prints one or more lines at a time.

PRINTBAR

Figure 3:
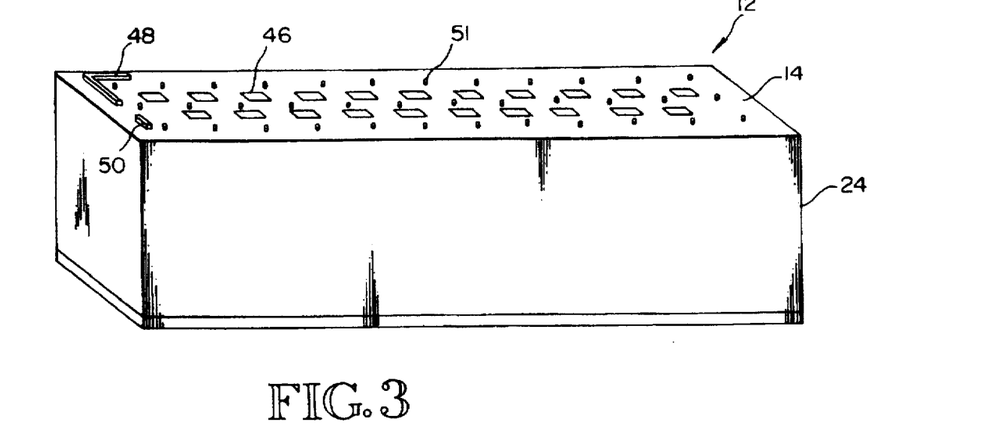
FIG. 3 is a perspective view of the printbar of the print element of FIGS. 1 and 2.
Figure 4:
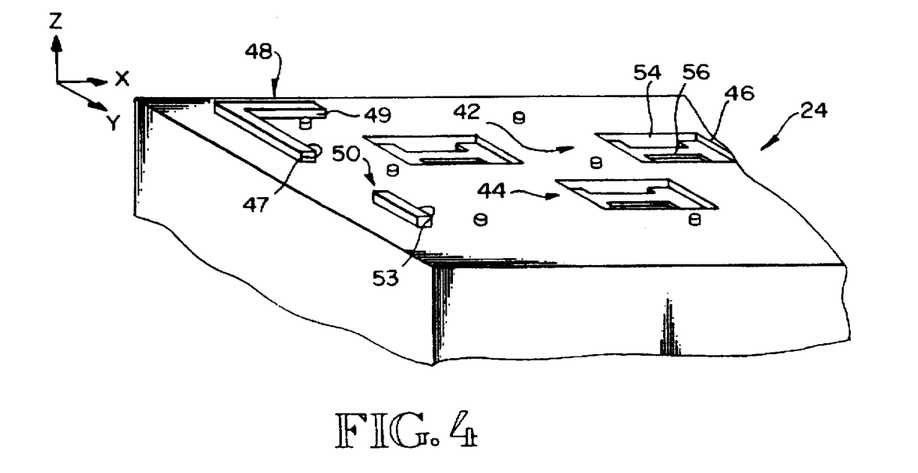
FIG. 4 is an enlarged partial sectional view of the printbar of FIG. 3 according to an embodiment of this invention.

The printbar 24 defines a resident ink reservoir (not shown) into which ink is received. In some embodiments, the reservoir is a closed source packed at the time of production. In other embodiments, the resident reservoir receives ink from an ink source external to the printbar 14. A cap 40 generally seals the reservoir. FIGS. 3 and 4 show the printbar 24 component of the printer element 12. In one embodiment the printbar 14 is approximately 12.5" by 1" by 2.5" and defines a printhead 14 to be approximately 12.5" by 1". At the surface receiving the flex circuit 26, the printbar 24 includes two rows 42, 44 of recesses 46, a 2-D reference barrier 48, a 1-D barrier 50 and several post portions 51 of fixtures 52 (see FIG. 6). When the printer element 12 is assembled the nozzle rows 32, 34 of a given group 30 align with a corresponding recess 46. FIG. 4 shows an enlarged view of a portion of the printbar 24. Each recessed area 46 includes two openings 54, 56 leading to the resident reservoir. During operation ink moves from the resident reservoir into the recessed areas 46. In effect, each recessed area 46 serves as a local reservoir for a group 30 of nozzles 16. One row 32 of nozzles 16 in a group 30 aligns with one opening 54. The other row 34 of nozzles 16 in the group 30 aligns with the other opening 56.

The 2-D reference barrier 48 (i.e., locally restricts 2 dimensions in printbar plane) is formed integral to the printbar 24 or is permanently attached to the printbar 24. The reference barrier 48 serves to restrict displacement of the flex circuit 26 edges positioned to abut the barrier 48. Two edges of flex circuit 26 are restricted by two respective walls 47, 49. In one embodiment the walls 47, 49 are generally orthogonal, as are the flex circuit 26 edges abutting the walls 47, 49. In another embodiment, the orientation of the walls 47, 49 and flex circuit 26 edges vary to be other than orthogonal. In still another embodiment, the walls 47, 49 are formed by two neighboring, non-adjoining 1-D type barriers. In still another embodiment, the 2-D reference barrier is formed by a heat stake (e.g., cylindrical or other shaped post) and precisely mated to an opening in the flex circuit 26.

The 1-D barrier 50 (i.e., locally restricts one dimension in printbar plane) also is formed integral to the printbar 24 or is permanently attached to printbar 24. The 1-D barrier 50 serves to restrict displacement of the flex circuit 26 edge abutting the barrier 50. In one embodiment the 1-D barrier is formed by a wall 53 against which a flex circuit 26 edge is received.

The posts 51 are formed integral to the printbar 24 or are permanently attached to printbar 24 and serve as the fixtures. In another embodiment the fixtures 52 also include caps 74 which serve to hold the flex circuit 26 to the printbar 24 (see FIGS. 11–12).

FLEX CIRCUIT

Figure 5:
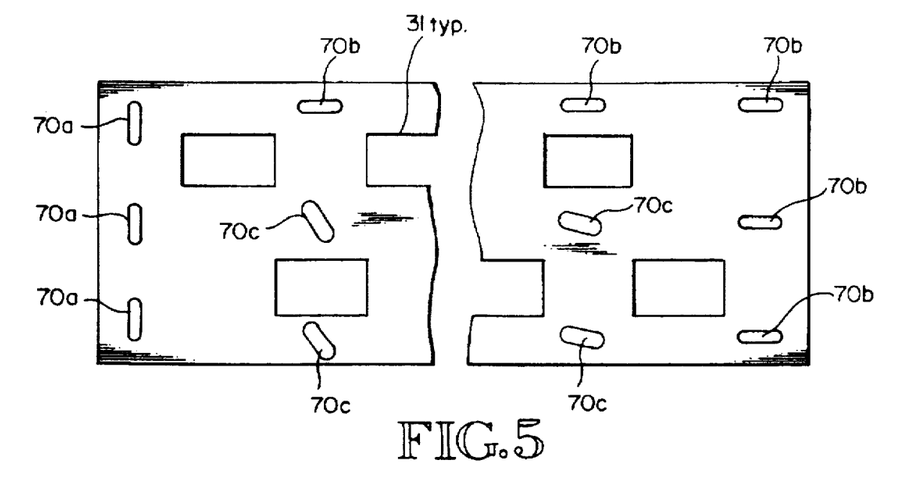
FIG. 5 is a perspective view of the flex circuit of FIGS. 1 and 2 according to an embodiment of this invention.

FIG. 5 shows the flexible printed circuit ("flex circuit") 26. The flex circuit 26 is a flexible printed circuit formed by a flexible insulative base material and several conductor paths. The conductive paths run from contact pads or an edge connector at the periphery to conductors within a nozzle group 30. Each conductive path is for carrying a signal from a peripheral contact pad to a nozzle group, or from a nozzle group to another nozzle group. According to various embodiments, the conductive paths serve to multiplex signals carried from memory to the nozzles. In a specific embodiment there are 16–24 conductors, although as few as two conductors can be used for a serial transfer methodology. For parallel transfer embodiments, the number of conductors depends on the degree of multiplexing performed.

In one embodiment the flex circuit 26 is formed from a base material made of polyamide or other flexible polymer material (e.g., polyester, poly-methyl-methacrylate) and conductive paths made of copper, gold or other conductive material. An embodiment of the flex circuit 26 with only the base material, conductive paths and peripheral contacts is available from the 3M Company of Minneapolis, Minn. The nozzle groups 30 then are added.

In one embodiment the flex circuit 26 defines nozzle orifices for each nozzle group 30. In another embodiment a nozzle plate is installed with the nozzle groups. As shown in FIGS. 2 and 5 the nozzle groups 30 form two rows running the length of the flex circuit 26. Each nozzle group include two rows 32, 34 of nozzles 16. According to one method, the respective orifices are laser drilled to achieve a precise area, orientation and position. For a 600 dpi PWA printhead, each group 30 spans approximately 0.5 inches in length along the printhead 14 and includes approximately 152 orifices per row 32 or 34. Other group sizes and densities are used in other embodiments. Also, other resolutions (e.g., 300 dpi) also are implemented in other embodiments.

In a specific embodiment of a 12 inch printhead 14 with 600 dpi resolution, there are 32 nozzle groups 30, and sixteen groups 30 per row 42, 44 (see FIGS. 3–4). The printhead 14 has extra length beyond, for example, an 11 inch pagewidth to ease a sheet alignment constraint. In one embodiment approximately 7400 nozzles define a 12 inch PWA printhead for servicing an 11 inch pagewidth at 600 dpi resolution. Each nozzle group 30 extends approximately 0.5 inches and is offset from adjacent groups 30 in an adjacent row 42, 44. Each nozzle group includes two rows 32, 34 of printhead nozzles 16. Each row includes at least 150 printhead nozzles 16. Each nozzle has the same diameter. According to various embodiments, the diameter is between approximately 10 and 50 microns.

The flex circuit 26 also defines slots 70 for receiving fixture posts 51. Each slot is elongated (e.g., 1–1.5 mm by 3 mm) to provide a linear path of relative displacement between a received post 51 and the local flex circuit area surrounding the slot 70.

Thermal Kinematic Fixturing Method

The printbar 24 is constructed as described for FIGS. 3 and 4 to have the recesses 46, barriers 48, 50 and posts 51. The flex circuit 26 is constructed as described for FIG. 5 to have (i) silicon substrates attached at the undersurface, (ii) nozzle groups 30 aligned along the length of the circuit 26, and (iii) through-slots 70 formed for receiving fixture posts 51. To further assemble the printer element 14, an adhesive is applied to the undersurface of the flex circuit 26. The flex circuit then is pressed to the printbar 24 with the posts 51 mating with slots 70. In addition, the flex circuit edges are set precisely to abut the 2-D barrier 48 and 1-D barrier 50. In some embodiments, caps 74 then are welded, screwed or otherwise attached to posts 51 to "button" down the flex circuit 26 to the printbar 24. FIGS. 2 and 6 show the assembled PWA printhead 14.

Figure 7:
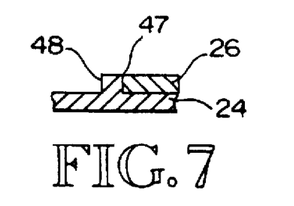
FIG. 7 is a cutaway view of the reference barrier and flex circuit connection of FIG. 6.

Because the slots 70 direct thermal displacement of the local flex circuit area relative to the fixture 51 along known paths, the fixturing method serves as a thermal kinematic fixturing method. The 2-D barrier 48 serves as a bench mark for the relative positioning of the flex circuit 26 and printbar 24. FIG. 7 shows the flex circuit 26 abutting the wall 47 of 2-D barrier 48. Similar abutment occurs relative to wall 49 of 2-D barrier 48 and wall 53 of 1-D barrier 50. Regardless of the thermal expansion and contraction, the flex circuit 26 remains in abutment with the barriers 48, 50. Thus, all displacement occurs relative to such fixed points.

Figure 8:
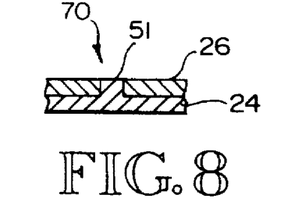
FIG. 8 is a cutaway view of a 1-D connection between the fixture and flex circuit of FIG. 6.
Figure 9:
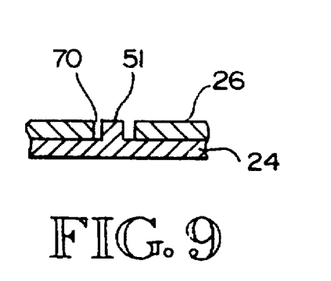
FIG. 9 is a cutaway view of a free-floating connection between the fixture and flex circuit of FIG. 6.

FIGS. 8 and 9 show the flex circuit 26 locally constrained by a post fixture 51. Regarding FIG. 8, the flex circuit 26 defines a slot 70 having a width approximating the diameter of post fixture 51. Regarding FIG. 9, the flex circuit 26 defines a slot having a width slightly wider than the diameter of the post fixture 51. During assembly the post fixtures 51 are mated to the slots 70. Each slot 70 and fixture combination defines a 1-D connection or a free-floating connection in the xy-plane of the printhead 14. A 1-D connection (i.e., connection allowing local displacement in one direction along xy-plane) is shown in FIG. 8. Because the width of the slot 70 is precisely the diameter of the post fixture 51, thermal displacement in the xy-plane is directed to occur along the length of the slot. Slots 70a have a y-axis orientation for allowing thermal displacement to occur along the y-axis. Slots 70b have an x-axis orientation allowing thermal displacement to occur along the x-axis.

A free-floating connection (i.e., connection allowing local displacement in alternative directions in xy-plane) is shown in FIG. 9. Because the width of the slot 70c is slightly wider than the post fixture 51 diameter, thermal displacement is free-floating in the xy-plane to occur along the x-axis, y-axis or any angle between the two axes.

Figure 10:
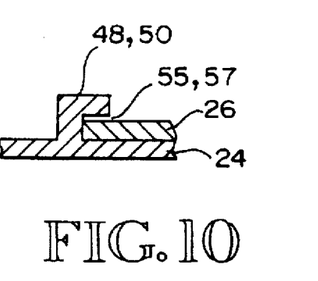
FIG. 10 is a cutaway view of the reference barrier and flex circuit connection according to an alternative reference barrier embodiment.
Figure 11:
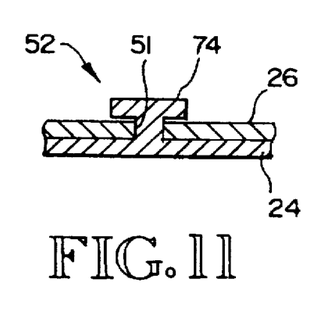
FIG. 11 is a cutaway view of a 1-D connection between the fixture and flex circuit according to an alternative fixture embodiment.
Figure 12:
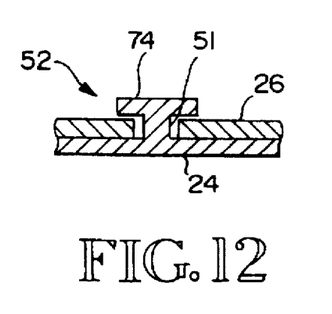
FIG. 12 is a cutaway view of a free-floating connection between the fixture and flex circuit according to an alternative fixture embodiment.

FIGS. 10–12 show alternate embodiments for the barrier 48, 50 and fixtures 52. Referring to FIG. 10, alternate embodiments of 2-D barrier 48 and 1-D barrier 50 have an upper wall 55, 57 with a height substantially the same as the thickness of the flex circuit 26. In some embodiments the upper wall has an adhesive sealant undercoating. Thus, the barriers 48, 50 also serve to restrain displacement out of the plane of the printbar 24 surface. Referring to FIGS. 11 and 12, alternate embodiments of the fixtures are shown. Fixture 52 includes a post fixture 51 and a cap 74. FIG. 11 depicts a 1-D connection, while FIG. 12 depicts a free-floating connection. In such alternate embodiments cap 74 restricts another degree of freedom (e.g., z-axis) by holding the flex circuit 26 to the printbar 24.

To achieve a PWA printhead 14 for printing reliably over an operating temperature range, the selection and layout of 1-D connections and free-floating connections are strategically chosen to direct thermal expansion and contraction along the length of the rows 32, 34 in each nozzle group 30 and maintain alignment of nozzles 16 and nozzle groups 30 along the length of the printhead 14. In one embodiment, floating-x slots 70b are used at a periphery of the flex circuit 26 along the length (e.g., x-axis) of the printhead 14. Floating-y slots 70a are used at a periphery of the flex circuit 26 along the width (e.g., y-axis) of the printhead 14 adjacent to the barriers 48, 50. Floating-xy slots 70c are used at other locations, including intermediate positions between and below rows 42, 44 of recesses 46 and corresponding nozzle groups 30. In one embodiment the slots 70a, 70b are approximately 1 mm wide and 3 mm long, while the posts 51 are approximately 1 mm in diameter. Slots 70c are slightly wider (e.g., 1.5 mm.).

The flex circuit corner or area abutting the reference barrier 48 is set accurately in three dimensions (x-axis, y-axis and z-axis) respective to the printbar 24. Other points of the flex circuit 26 away from the barrier 48 are floating locally (in a thermal kinematic sense) in one or two planar directions over a small distance. Such small distance is a function of the distance between the reference barrier 48 and the point on the flex circuit 26, the coefficient of thermal expansion of the flex circuit material, and the total temperature change from a rest temperature condition (i.e., ambient room temperature) to an operating temperature condition. In one embodiment the slots 70 are oriented to generally point toward barrier 48.

Meritorious and Advantageous Effects

One advantage of the invention is that relative displacements between flex circuit 26 and printbar 24 are directed and reproducible over a given operating temperature range. An advantageous effect is that nozzle 16 alignment is o substantially maintained across the printhead 14 for variations in temperature. Another advantageous effect is that nozzle spacing changes uniformly across the printhead 14 for variations in temperature. Another advantageous effect is that nozzle spacing returns to an original spacing upon return to a rest temperature. A meritorious effect of this invention is that the reproducible thermal response enables print quality to be reliable over an entire operating temperature range.

Although a preferred embodiment of the invention has been illustrated and described, various alternatives, modifications and equivalents may be used. For example, although the fixtures are depicted as cylindrical posts or cylindrical posts having a round cap, alternative embodiments of the invention have posts or posts and caps of alternate shape. Also, although the reference barrier is depicted as having two orthogonal edges, alternative embodiments of the invention have edges defining a different angle. Also, the structure of the reference barrier varies in other embodiments to include two neighboring structures defining separate respective 1-D barriers where the degree of freedom restricted varies in the two structures. Therefore, the foregoing description should not be taken as limiting the scope of the inventions which are defined by the appended claims.

What is claimed is:

1. A page-wide-array printhead of inkjet nozzles, the printhead having a flexible circuit thermal-kinematically fixed relative to a printbar, the printbar undergoing thermal expansion in response to increases in temperature and undergoing thermal contraction in response to decreases in temperature, the printhead comprising:

a flexible circuit adhesively attached to the printbar along a plane of the printbar and defining a plurality of elongated slots, each one of the plurality of slots defining a respective slot direction, the flexible circuit undergoing thermal expansion in response to increases in temperature and undergoing thermal contraction in response to decreases in temperature, wherein the flexible circuit and printbar having differing thermal coefficients of expansion;

a reference barrier on the printbar having a first wall extending along a first direction and a second wall extending along a second direction, the second direction differing from the first direction, the reference barrier for limiting local displacement of the flexible circuit adjacent to the barrier in two directions of the printbar plane during either one or both of thermal expansion or contraction of the flexible circuit, wherein said two directions of limited displacement of the flexible circuit are perpendicular to the first direction adjacent to the first wall and perpendicular to the second direction adjacent to the second wall; and a plurality of fixtures on the printbar, each one of said plurality of fixtures extending through a respective slot; and wherein a one of said plurality of fixtures and a respective slot defines a connection between the flexible circuit and printbar allowing relative thermal displacement of the flexible circuit and printbar in the printbar plane during either one or both of thermal expansion or contraction.

2. The printhead of claim 1, in which first ones of said plurality of fixtures and first respective slots define a plurality of first connections between the flexible circuit and printbar, each one of the plurality of first connections allowing relative thermal displacement of the flexible circuit and printbar only along the slot direction of said one of the plurality of first connections' respective slot in a local area during either one or both of thermal expansion or contraction.

3. The printhead of claim 2, wherein second ones of said plurality of fixtures and second respective slots define a plurality of second connections between the flexible circuit and printbar, each one of the plurality of second connections allowing relative thermal displacement of the flexible circuit and printbar in any direction in the printbar plane during either one or both of thermal expansion or contraction.

4. The printhead of claim 1, in which at least one of said plurality of fixtures comprises a post protruding from the printbar.

5. The printhead of claim 4, in which said at least one of said plurality of fixtures further comprises a cap attached to the post for extending over a portion of the flexible circuit.

6. The printhead of claim 1, further comprising an edge barrier for limiting local displacement of the flexible circuit adjacent to the edge barrier in the plane during either one or both of thermal expansion or contraction of the flexible circuit.

7. The printhead of claim 1, in which the flexible circuit further defines a plurality of orifices for respective inkjet nozzles.

8. A method for thermal-kinematically fixing a flexible circuit to a page-wide-array printbar, wherein the flexible circuit and printbar undergo thermal expansion during increases in temperature and undergo thermal contraction during decreases in temperature, the flexible circuit and printbar having differing thermal coefficients of expansion, and wherein a reference barrier occurs on the printbar, the reference barrier having a first wall extending along a first direction and a second wall extending along a second direction, the second direction differing from the first direction, the method comprising the steps of:

abutting the flexible circuit to the reference barrier on the printbar for limiting local displacement of the flexible circuit adjacent to the barrier in two directions along a plane of the printbar during either one or both of thermal expansion or contraction of the flexible circuit, wherein said two directions of limited displacement of the flexible circuit are perpendicular to the first direction adjacent to the first wall of the reference barrier and perpendicular to the second direction adjacent to the second wall of the reference barrier, and wherein the flexible circuit has a plurality of elongated slots, each one of said plurality of slots defining a respective slot direction, and wherein the printbar has a plurality of posts;

mating each one of the plurality of printbar posts to a corresponding flexible circuit slot;

adhesively attaching the flexible circuit to the printbar to hold the flexible circuit to the printbar; and wherein a one of said plurality of posts and a respective slot define a connection between the flexible circuit and printbar allowing relative thermal displacement of the flexible circuit and printbar in the printbar plane during either one or both of thermal expansion or contraction.

9. The method of claim 8, further comprising the step of attaching a cap to each one of said posts.

10. The method of claim 8, in which first ones of said plurality of posts and first respective slots define a plurality of first connections between the flexible circuit and printbar, each one of the plurality of first connections allowing relative thermal displacement of the flexible circuit and printbar only along the slot direction of said one of the plurality of first connections respective slot in a local area during either one or both of thermal expansion or contraction.

11. The method of claim 8, wherein second ones of said plurality of posts and second respective slots define a plurality of second connections between the flexible circuit and printbar, each one of the plurality of second connections allowing relative thermal displacement of the flexible circuit and printbar in any direction in the printbar plane during either one or both of thermal expansion or contraction.

12. The method of claim 8, further comprising the step of abutting the flexible circuit against an edge barrier for limiting local displacement of the flexible circuit adjacent to the edge barrier in the printbar plane during either one or both of thermal expansion or contraction of the flexible circuit.

* * * * *